(12) United States Patent
Miller et al.

(10) Patent No.: US 12,075,142 B2
(45) Date of Patent: Aug. 27, 2024

(54) MOVEABLE FLEX CIRCUIT FOR CAMERAS WITH MOVEABLE IMAGE SENSORS

(71) Applicant: Apple Inc., Cupertino, CA (US)

(72) Inventors: Scott W. Miller, Santa Clara, CA (US); Zachary W. Birnbaum, Saratoga, CA (US); Andrew S. Jozefov, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 51 days.

(21) Appl. No.: 17/741,925

(22) Filed: May 11, 2022

(65) Prior Publication Data

US 2023/0069902 A1 Mar. 9, 2023

Related U.S. Application Data

(60) Provisional application No. 63/241,163, filed on Sep. 7, 2021.

(51) Int. Cl.
*H04N 23/54* (2023.01)
*H04N 23/55* (2023.01)
*H04N 23/57* (2023.01)

(52) U.S. Cl.
CPC ............. *H04N 23/54* (2023.01); *H04N 23/55* (2023.01); *H04N 23/57* (2023.01)

(58) Field of Classification Search
CPC ........ H04N 23/54; H04N 23/55; H04N 23/57; H04N 23/687; H04N 23/67; H04N 23/683; H04N 23/65; H04N 23/68; H04N 25/60; H05K 2201/056; H05K 1/0281; H05K 1/028; H05K 2201/10121; H05K 2201/10151; H05K 1/147; H05K 2201/052; H05K 2201/053; H05K 2201/09081; G02B 27/646; G02B 7/09; G02B 7/04; G03B 2205/0069; G03B 5/02; G03B 13/36; G03B 2205/0007; G03B 3/10; G03B 30/00; G03B 5/00; G03B 17/02; G03B 2205/0015
See application file for complete search history.

(56) References Cited

U.S. PATENT DOCUMENTS

| | | | |
|---|---|---|---|
| 7,623,782 B2 | 11/2009 | Yu | |
| 9,655,524 B2 | 5/2017 | Wheatley | |
| 2009/0126976 A1* | 5/2009 | Iida | H05K 1/028 |
| | | | 29/829 |
| 2014/0307114 A1 | 10/2014 | Kim | |
| 2020/0120277 A1* | 4/2020 | Wade | H04N 25/60 |
| 2021/0084202 A1* | 3/2021 | Xuepeng | H04N 23/687 |
| 2021/0092297 A1* | 3/2021 | Smyth | H05K 1/028 |

(Continued)

FOREIGN PATENT DOCUMENTS

| | | | | |
|---|---|---|---|---|
| CN | 112886788 | 6/2021 | | |
| GB | 2615738 A | * 8/2023 | ........... F03G 7/0614 |

(Continued)

*Primary Examiner* — Abdelaaziz Tissire
(74) *Attorney, Agent, or Firm* — Brownstein Hyatt Farber Schreck, LLP

(57) ABSTRACT

A flex circuit that may accommodate movement of an image sensor within a camera. The flex circuit generally includes a plurality of planar segments between a first end that is fixed relative to the image sensor and a second end that is fixed relative to one or more camera components. One or more of the planar segments twists when the image sensor is moved within the camera.

19 Claims, 16 Drawing Sheets

(56) References Cited

U.S. PATENT DOCUMENTS

| | | | |
|---|---|---|---|
| 2021/0321024 A1* | 10/2021 | Song | H05K 1/147 |
| 2022/0014677 A1* | 1/2022 | Smyth | G02B 7/09 |
| 2022/0066128 A1* | 3/2022 | Wade | G02B 27/646 |
| 2022/0086317 A1* | 3/2022 | Paik | H04N 23/57 |
| 2022/0137486 A1* | 5/2022 | Oh | G02B 7/08 |
| | | | 359/554 |
| 2022/0179230 A1* | 6/2022 | Sue | G02B 27/646 |
| 2022/0244562 A1* | 8/2022 | Jang | G03B 5/06 |
| 2023/0328348 A1* | 10/2023 | Pantelidis | H04N 23/687 |
| | | | 348/208.11 |

FOREIGN PATENT DOCUMENTS

| | | |
|---|---|---|
| WO | WO2015/100396 | 7/2015 |
| WO | WO2021/023150 | 2/2021 |

\* cited by examiner

MOVEABLE FLEX CIRCUIT FOR CAMERAS WITH MOVEABLE IMAGE SENSORS

CROSS-REFERENCE TO RELATED APPLICATIONS

This application claims the benefit under 35 U.S.C. § 119(e) of U.S. Provisional Patent Application No. 63/241,163, filed Sep. 7, 2021, the contents of which are incorporated herein by reference in their entirety.

FIELD

The described embodiments generally relate to flex circuits that accommodate movement of an image sensor within a camera.

BACKGROUND

Cameras continue to be an important feature of consumer electronics devices such as smartphones, tablets, and computers. Space is at a premium in these devices, and there is a need for cameras that provide for high quality imaging in a small form factor. Some cameras may be configured to move a camera image sensor relative to other components of the camera (e.g., a lens and/or a housing) to provide for autofocus and/or image stabilization capabilities. In these cameras, there is a need to communicate image data and other signals from the image sensor to other device components. A moving image sensor may make this communication difficult, as the component carrying the signals from the image sensor would ideally need to be able to accommodate this movement.

SUMMARY

Described here are cameras with moveable image sensors and flex circuits that may be used with these cameras. In general, the flex circuit may include a plurality of planar segments that are connected via one or more bends. The flex circuit may be fixed relative to the image sensor, and may be positioned within the camera such that movement of the image sensor along a first direction causes twisting in one or more of the plurality of segments.

Some embodiments may include a camera comprising a lens, an image sensor positioned to receive light through the lens, and an actuator assembly configured to move the image sensor along a first direction within the camera. The camera may further comprise a flex circuit, the flex circuit comprising a first end, a second end, and plurality of planar segments comprising a first segment connected to a second segment via a first bend, and a third segment connected to the second segment via a second bend. The plurality of planar segments may connect the first end to the second end, the first end may be fixed relative to the image sensor and moveable relative to second end when the image sensor moves along the first direction, and the flex circuit may be positioned such that the first segment twists when the image sensor moves along the first direction.

In some variations, the first segment is oriented such that a normal vector of the first segment is perpendicular to the first direction and the third segment is oriented such that a normal vector of the third segment is perpendicular to the first direction. In some of these variations, the first segment is parallel to the third segment. In some variations, the second segment is oriented such that a normal vector of the second segment is parallel to the first direction. In other variations the second segment is oriented such that a normal vector of the second segment is perpendicular to the first direction.

In some variations the flex circuit further comprises a fourth segment, wherein the fourth segment is connected to the first segment at a third bend. The fourth segment may be connected to the first end at a fourth bend. The third segment is connected to the second end at a fifth bend. In some variations where the flex circuit comprises a fourth segment the flex circuit further comprises a fifth segment, wherein the fifth segment is connected to the third segment at a fourth bend.

The camera may be configured such that the first direction is parallel to an optical axis of the camera. The camera may comprise a sensor carrier fixed relative to the image sensor and a lens holder connected to the lens, wherein the second segment is positioned between the sensor carrier and the lens holder. In other variations the camera may comprise a sensor carrier fixed relative to the image sensor and a lens holder connected to the lens, wherein the sensor carrier is positioned between the second segment and the lens holder.

Other embodiments may include a camera, comprising a lens, an image sensor positioned to receive light through the lens, an actuator assembly configured to move the image sensor along a first direction within the camera, and a flex circuit comprising a plurality of planar segments connected via one or more bends. The flex circuit may connected to and positioned relative to the image sensor such that at least of the plurality of planar segments twists during movement of the image sensor along the first direction.

In some of these variations, the at least one of the plurality of planar segments comprises a first segment, wherein a length of the first segment is oriented perpendicular to the first direction and a width of the first segment is oriented parallel to the first direction, and wherein the first segment twists around the length of the first segment during movement of the image sensor along the first direction. The flex circuit may comprise a first end fixed relative to the image sensor, wherein the first segment is connected to the first end at a first bend. In some variations, the first direction is parallel to an optical axis of the camera.

Another embodiment describes an arrangement comprising an image sensor having an optical axis, and a flex circuit comprising a first end fixed relative to the image sensor, a second end, and a plurality of planar segments connecting the first end to the second end and comprising a first segment, a second segment, and a third segment. The first segment may be connected to the second segment at a first bend and the second segment is connected to the third segment at a third bend, and the first segment may oriented such that a normal vector of the first segment is perpendicular to the optical axis of the image sensor and the third segment may be oriented such that a normal vector of the third segment is perpendicular to the optical axis of the image sensor. In some of these variations, first segment is parallel to the third segment. In some variations, the second segment is oriented such that a normal vector of the second segment is parallel to the optical axis of the image sensor. In other variations, the second segment is oriented such that a normal vector of the second segment is perpendicular to the optical axis of the image sensor.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
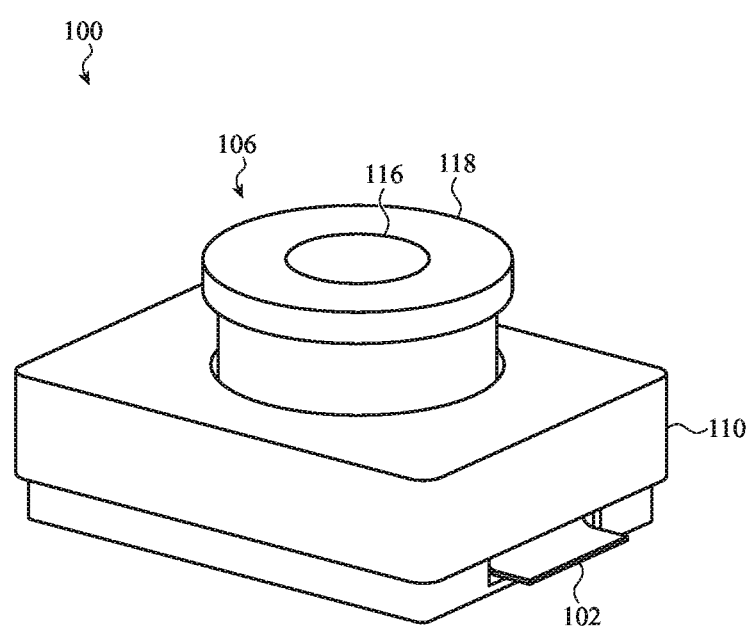
FIG. 1A shows a perspective view of an example camera with a moveable image sensor and a flex circuit.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

Directional terminology, such as "top", "bottom", "upper", "lower", "front", "back", "over", "under", "above", "below", "left", "right", "vertical", "horizontal", etc. is used with reference to the orientation of some of the components in some of the figures described below, and is not intended to be limiting. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Described here are flex circuits that may be used in a camera with a moveable image sensor. In general, the flex circuit may include a plurality of planar segments that are connected via one or more bends. The flex circuit may be fixed relative to the image sensor, and may be positioned within the camera such that movement of the image sensor along a first direction causes twisting in one or more of the plurality of segments. This twisting may allow the flex circuit to accommodate the movement of the image sensor along the first direction while having a negligible impact on the camera's overall footprint.

Figure 1B:
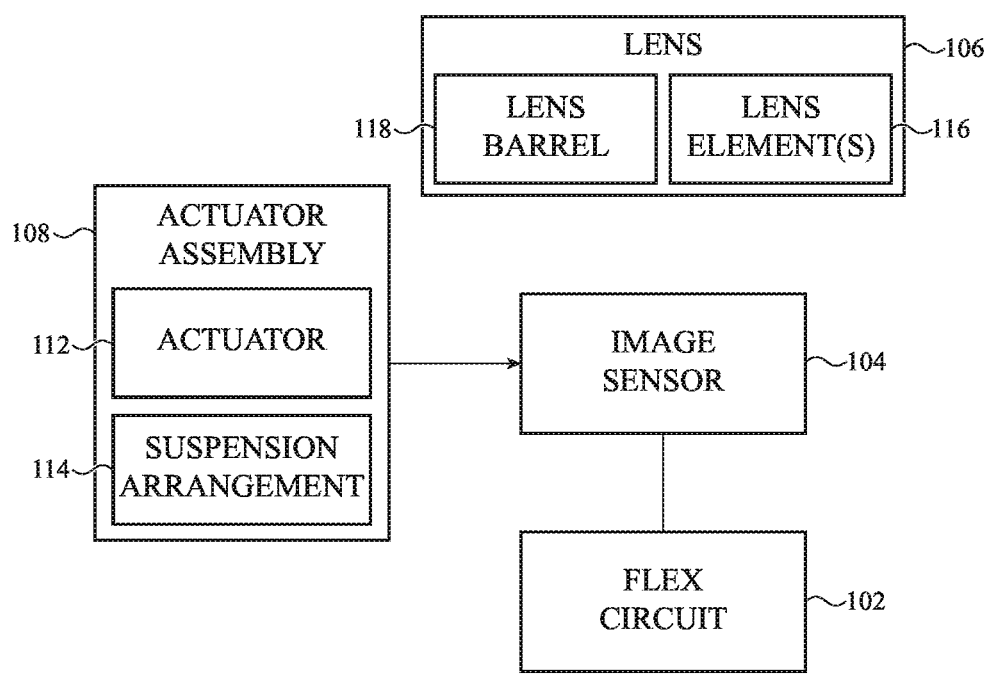
FIG. 1B shows a schematic block diagram of example components of the camera of FIG. 1A.

The flex circuits described here may be used in any suitable camera having a moveable image sensor. FIGS. 1A and 1B show a perspective view and a schematic block diagram of a camera 100 that may utilize a flex circuit 102 as described here. As shown there, the camera may comprise the flex circuit 102, an image sensor 104, lens 106, an actuator assembly 108, and a housing 110. The housing 110 may be configured to at least partially enclose the various components of camera 100, and in some variations may act to shield internal camera components from electromagnetic interference (as well as to shield other components or devices external to the housing from electromagnetic interference originating within the camera). The lens 106 comprises one or more lens elements 116 configured to direct light received by the camera toward the image sensor 104. The lens 106 may further comprise a lens barrel 118 that houses some or all of the lens elements. In some instances, the camera 100 may be configured to have a folded optics arrangement, where the camera 100 further comprises one or more mirrors or prisms to redirect the light captured by the camera. It should be appreciated that in a folded optics arrangement, the optical axis of the lens 106 and camera 100 may extend along multiple directions (i.e., a light folding element such as a prims or mirror may change the direction of the optical axis). For the purpose of this application, the optical axis of a camera is considered to be the portion of optical axis of a lens as light exits the lens toward an image sensor. Additionally, for the purpose of this application the optical axis of an image sensor is considered to a vector normal to the plane of the image sensor, which is typically parallel to the optical axis of a lens as light exits the lens toward the image sensor.

The image sensor 104 may receive light through the lens 106, and may generate one or more signals that may convey information about the light received during imaging (which are conveyed off the image sensor 104 using flex circuit 102). The image sensor may be any suitable sensor, such as a CCD, CMOS sensor, or the like. As mentioned above, the image sensor 104 may be configured to move within the camera (e.g., relative to at least the housing 110). For example, the image sensor 104 may be moved relative to the lens 106 along the optical axis of the camera 100 to adjust the camera's focus, which may allow the camera 100 to provide autofocus capabilities. Additionally or alternatively, the image sensor 104 may be moved relative to the lens in one or more directions perpendicular to the optical axis of the camera 100, which may allow the camera 100 to provide optical image stabilization capabilities.

It should be appreciated that the cameras described may be configured to perform both autofocus and optical image stabilization, or it may be configured to perform only one of these operations. Furthermore, in some instances, the camera 100 may be further configured to adjust the position or optical power of the lens 106 to assist with autofocus and/or optical image stabilization operations. This may be achieved by moving one or more lens elements of the lens 106 relative to the image sensor 104. Additionally or alternatively, the lens 106 may comprise a variable focus lens element (e.g., a liquid lens), which may be actuated to adjust the optical power and/or optical axis of the lens element.

Autofocus and optical image stabilization operations may be performed by any suitable combination of image sensor 104 movement and lens 106 adjustments. As a couple non-limiting examples, U.S. Patent Application Publication Nos. US2019/0141248 and US2021/0080807, the contents of which are incorporated herein by reference in their entireties, respectively describe i) a camera that moves an image sensor perpendicular to an optical axis of the camera (for optical image stabilization) and that moves a lens along an optical axis (for autofocus), and ii) a camera that moves the image sensor in three dimensions (for both autofocus and image stabilization). For the purpose of this application, it is assumed that the image sensor 104 is moveable within the camera along at least one direction.

Returning to FIG. 1, the camera may further comprise an actuator assembly 108 configured to move the image sensor within the camera 100. The actuator assembly 108 typically comprises an actuator 112 and a suspension arrangement 114. The actuator 112 is configured to generate the forces to needed to move the image sensor, and may comprise a voice coil motor, a comb drive, or the like. In embodiments where the actuator 112 comprises a voice coil motor, the voice coil motor may comprise a magnet and a coil, one of which may be fixed relative to the image sensor 104 (either via a direct connection to the image sensor, or via indirect connection via one or more intervening components) and the other of which may be fixed within the camera in a manner that allows the image sensor 104 to move relative thereto. The coil may be positioned within the magnetic field of the magnet such that when current is driven through the coil, a Lorentz force is generated that can create relative movement between the coil and magnet, which in turn may move the image sensor within the camera. It should be appreciated that some embodiments may include an actuator 112 with a plurality of voice coil motors, each of which may be used to generate Lorentz forces as discussed above. U.S. Patent Publication No. US2019/0141248, which was previously incorporated by reference, describes a non-limiting example of an actuator that utilizes voice coil motors to move an image sensor within a camera.

The suspension arrangement 114 may be configured to suspend the image sensor 104 (as well as one or more other components connected thereto) within the camera 100, and may allow the image sensor 104 to move within camera 100 along one or more directions. As a couple of non-limiting examples, the suspension arrangement 114 may comprise one or more suspension elements, such as flexures (e.g., leaf spring(s), suspension wire(s), flexure arms(s), or the like) and/or one or more bearings (e.g., ball bearing(s), roller bearing(s), or the like. In instances where the suspension arrangement 114 comprises one or more flexures, the flexures may provide a moveable connection between the image sensor (for example, via a holding structure that carries the image sensor) and one or more additional structures in the camera. In instances where the suspension arrangement 114 comprises one or more bearings, the bearings may be positioned between the moving image sensor 104 (e.g., via a holding structure that carries the image sensor) and one or more additional structures in the camera, and may guide image sensor movement.

Figure 2A:
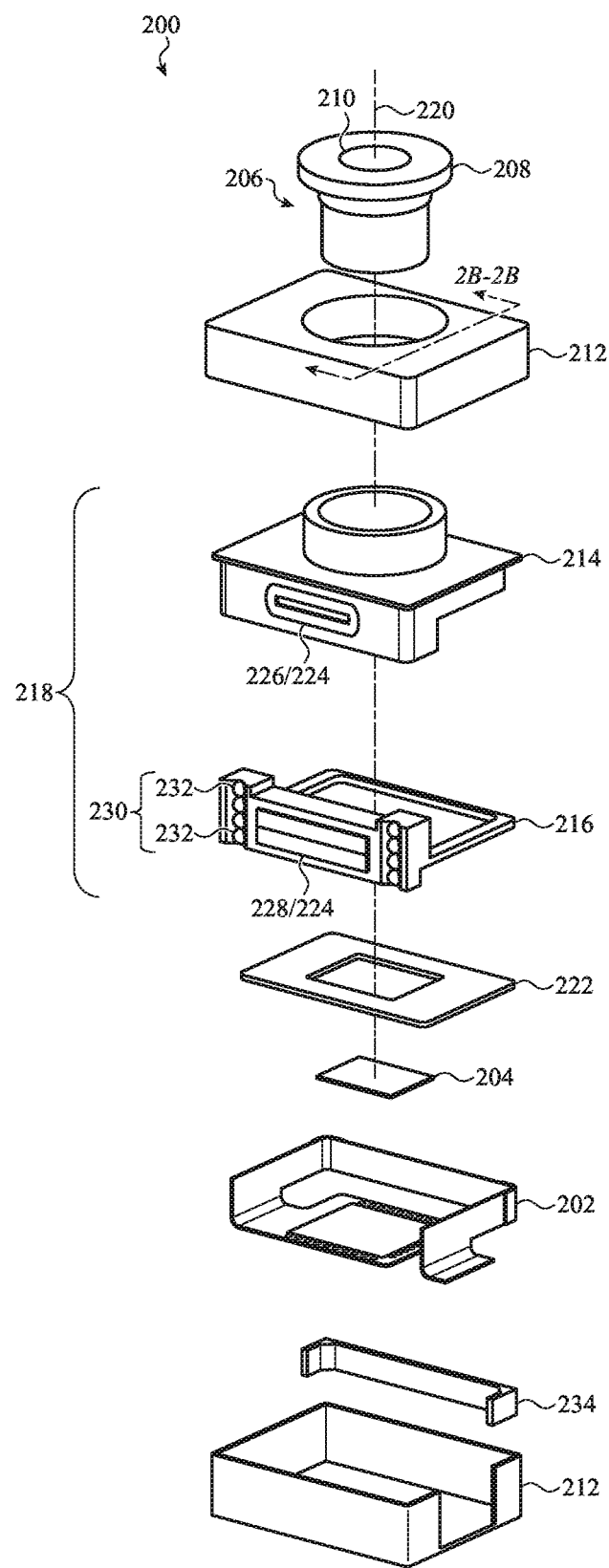
FIGS. 2A and 2B show an exploded view and a cross-sectional side view, respectively, of an example camera that includes a flex circuit and an image sensor that is moveable along an optical axis of the camera.
Figure 2B:
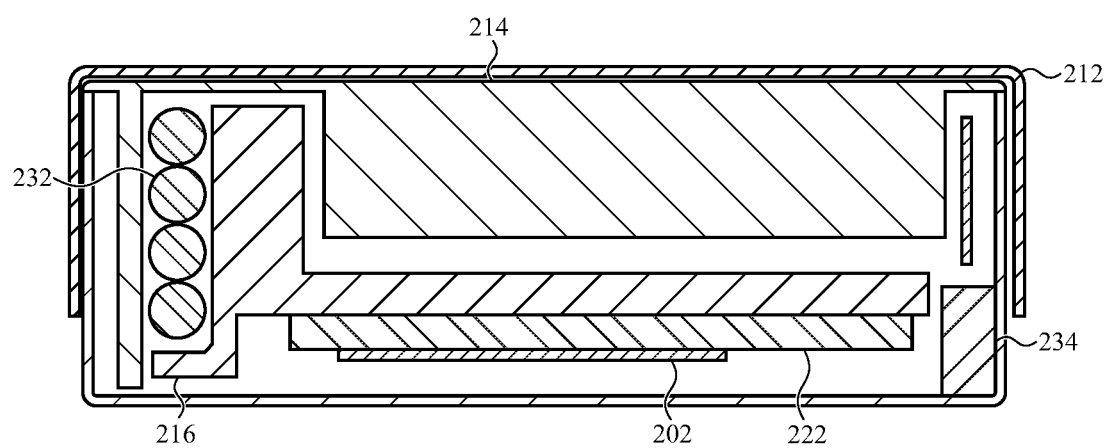

FIGS. 2A and 2B show an exploded perspective view and a cross-sectional side view, respectively, of an example camera 200 that may use the flex circuits described here. As shown there, camera 200 may comprise a flex circuit 202, an image sensor 204, and a lens 206 having a lens barrel 208 and lens element 210 (a single lens element 210 is shown in FIG. 2A, but it should be appreciated that the lens 206 may comprise a plurality of lens elements), each of which may be configured as described above with respect to FIGS. 1A and 1B. Camera 200 may further comprise a housing 212 (which may be made from a plurality of housing elements), a lens holder 214 which may hold the lens 206 relative to the rest of camera 200, a sensor carrier 216 that may be fixed relative to the image sensor 204, and an actuator assembly 218.

This embodiment of camera 200 shown in FIGS. 2A and 2B may be configured to move image sensor 204 only along an optical axis 220 of camera 200 (e.g., to provide autofocus capabilities), though it should be appreciated that different embodiments of the cameras described here may be configure to move the image sensor 204 along multiple directions. Specifically, the actuator assembly 218 may be configured to move the sensor carrier 216 relative to the lens holder 214 along a first direction (e.g., optical axis 220). The sensor carrier 216 is fixed with respect to the image sensor 204, such that movement of the sensor carrier 216 along the optical axis 220 also moves the image sensor 204 along the optical axis 220. The sensor carrier 216 may be directly connected to the image sensor 204, or may be indirectly connected to the image sensor 204 via one or more intervening components (e.g., via a substrate 222, which may be connected to both the image sensor 104 and the sensor carrier 216). The sensor carrier 216 may be further fixed relative to a first end of the flex circuit 202 (via a direct connection and/or an indirect connection via one or more intervening components such as substrate 222), such that movement of the sensor carrier 216 also moves the first end of the flex circuit 202.

In the variation of camera 200 shown in FIGS. 2A and 2B, the actuator assembly 218 may comprise voice coil motor actuator 224 that includes coil 226 and magnet 228 and a suspension arrangements 230 comprising ball bearings 232 (though actuator assembly 218 may include any combination of actuators and suspension elements described above). As shown there, lens holder 214 may hold coil 226 and sensor carrier 216 may hold magnet 228, and current may be driven through the coil 226 to control movement between the coil 226 and magnet 228 along the optical axis 220 (which thereby controls movement of the sensor carrier 216 and image sensor 104 along the optical axis 220). In other embodiments, the sensor carrier 216 may hold the coil 226 while the lens holder 214 may hold the magnet 228. In some of these variations, the flex circuit 202 may be configured to carry one or more signals (e.g., power and/or control signals) that may be used to control the current through the coil 226 (e.g., via a driver (not shown) that may be carried by the sensor carrier 216).

Ball bearings 232 may be positioned between, and in contact with, respective surfaces of the lens holder 214 and the sensor carrier 216. The ball bearings 232 may allow the sensor carrier 216 to slide relative to the lens holder 214, and may also constrain the movement of the sensor carrier 216 so that the sensor carrier only move in a single direction (e.g., along the optical axis 220). While shown in FIGS. 2A and 2B as having ball bearings 232, it should be appreciated that the suspension arrangement 230 may comprise any suitable flexure elements (or combination of flexure elements) such as those described above.

While lens holder 214 is shown in FIGS. 2A and 2B as a single structure holding lens 206, holding magnet 228, and being in contact with ball bearings 232, it should be appreciated that the functions need not be performed by a plurality of individual structures. For example, lens holder 214 may instead be divided into multiple discrete components, each of which performs a different function (or combination of functions).

In some variations, camera 200 may comprise an end stop 234. Generally, an end stop is a structure that is configure to limit the movement of a component within the camera 200 (which may prevent that component from contacting or otherwise interacting with other structures within the camera). In some instances, an end stop may be a separate insert that is placed within the camera 200 for the purpose of providing an end stop (such as end stop 234 shown in FIGS. 2A and 2B), while in other instances one camera component may act as an end stop for another camera component (as will be described in more detail below). It should be appreciated that for a given camera component (e.g., a flex circuit), the camera 200 may comprise multiple end stops, each of which is configured to limit that component movement in a given direction. Similarly, a given end stop may act as an end stop for a plurality of components.

For example, the end stop 234 shown in FIGS. 2A and 2B may be configured to limit downward movement (i.e., movement away from the lens 206) of the flex circuit 202. Specifically, the end stop 234 may be positioned between a portion of the flex circuit 202 and the housing 212. Movement of the portion of flex circuit 202 shown in FIG. 2B will eventually cause the flex circuit 202 to come into contact with end stop 234, which may prevent (or otherwise limit) further movement of flex circuit 202 in that direction. Optionally, end stop 234 as shown in FIGS. 2A and 2B may be configured to act as an end stop for sensor carrier 216. As shown there, end stop 234 may be positioned between the sensor carrier 216 and the housing 212 in one more directions perpendicular to the optical axis 220 (the embodiment of end stop 234 is shown in FIGS. 2A and 2B as positioned between sensor carrier 216 and housing 212 in multiple directions), such that movement in any of these directions will eventually cause the sensor carrier 216 to contact the end stop 234 (and prevent or otherwise limit further movement of the sensor carrier 216).

In general, it may be preferable to the flex circuit 202 to not contact any end stops during normal operation of the device, so that these end stops limit unintended movement of the flex circuit 202 during unexpected events (e.g., shock events that may occur when the camera is dropped or otherwise experiences a significant motion not expected from normal device usage). For example, the camera 200 and actuator assembly 218 may be able to move the sensor carrier 216 (and image sensor 204) through a predetermined range of positions (an "operating range") during operation of the camera 200. In the absence of external forces, movement of the sensor carrier 216 across the operating range will not result in the flex circuit 202 contacting the end stop(s). In a shock event, however, additional forces applied to the camera may cause additional movement of the flex circuit 202 within the camera, and the end stop(s) may constrain this additional movement.

As mentioned above, the flex circuits described here may be configured to connect a moving image sensor The flex circuit may be fixed relative to the image sensor, and may be positioned within the camera such that movement of the image sensor along a first direction causes torsional strain (i.e., twisting around a and twisting in one or more of the plurality of segments. This twisting may allow the flex circuit to accommodate the movement of the image sensor along the first direction while having a minor impact on the overall camera size. For example, in variations where the first direction is parallel to the optical axis of the camera, some of the flex circuits described below may not require any additional clearance (or camera growth) along the optical axis, which may especially be beneficial when a camera is incorporated into a thin device where space along the optical axis is especially limited.

In general, the flex circuits described here may be made from a flexible printed circuit board (PCB), and may be formed in a flat sheet, which may be folded to create the various shapes shown in the following embodiments. Folding the flex circuit may form a bend that acts an interface between two adjoining planar segments of the flex circuit (each of which will have a different planar orientation). Accordingly, a plurality of bends may be formed in the flex circuit to create a plurality of planar segments, such as those described throughout this application, where each bend forms the boundary between adjacent planar segments. Additionally, the flex circuit may comprise one or more turns, which for the purpose of this application refers to a change in direction within the plane of the flex circuit. In other words, turns are positioned within a segment while bends are positioned between different segments. The bends and turns help define the shape and position of the various segments of the flex circuit, and in turn sets the overall shape of the flex circuit.

Figure 3A:
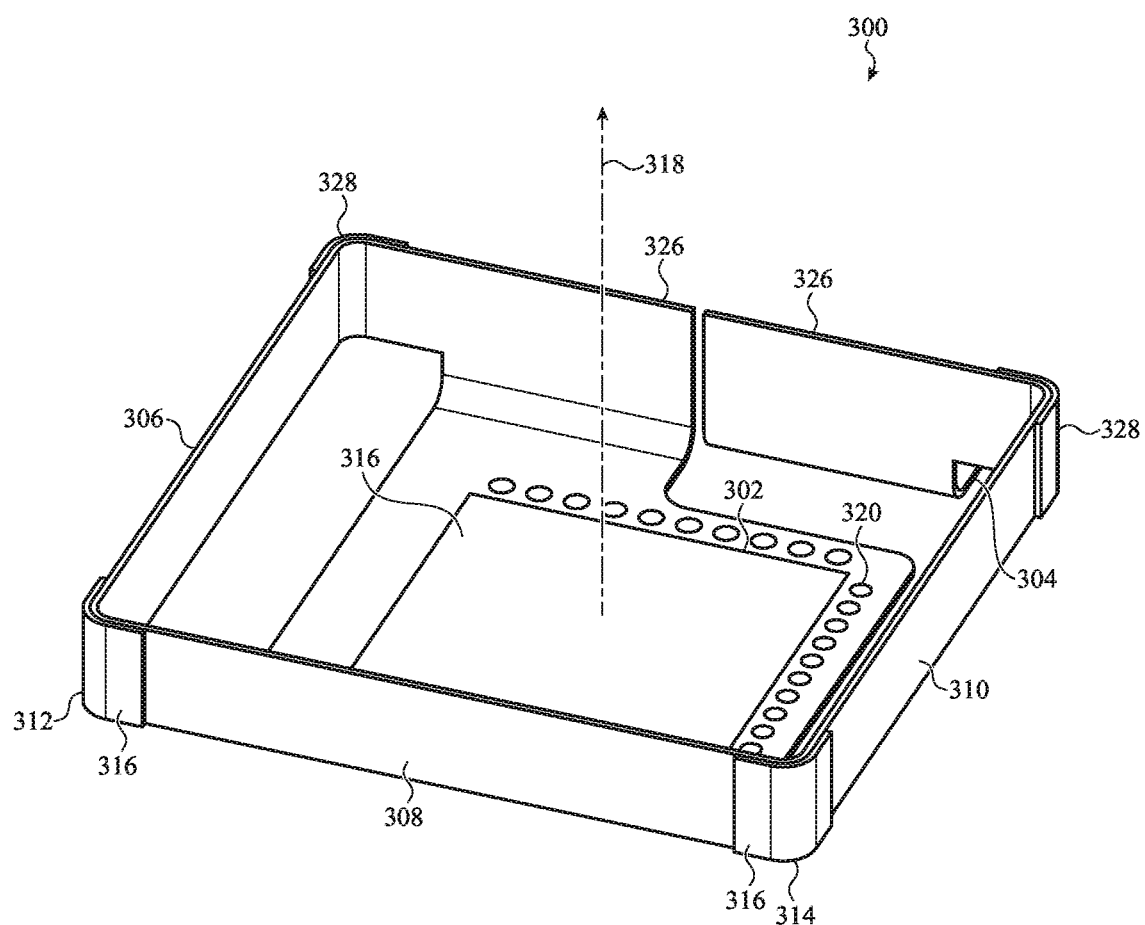
FIGS. 3A and 3B show perspective views of a flex circuit for use with the cameras described here.
Figure 3B:
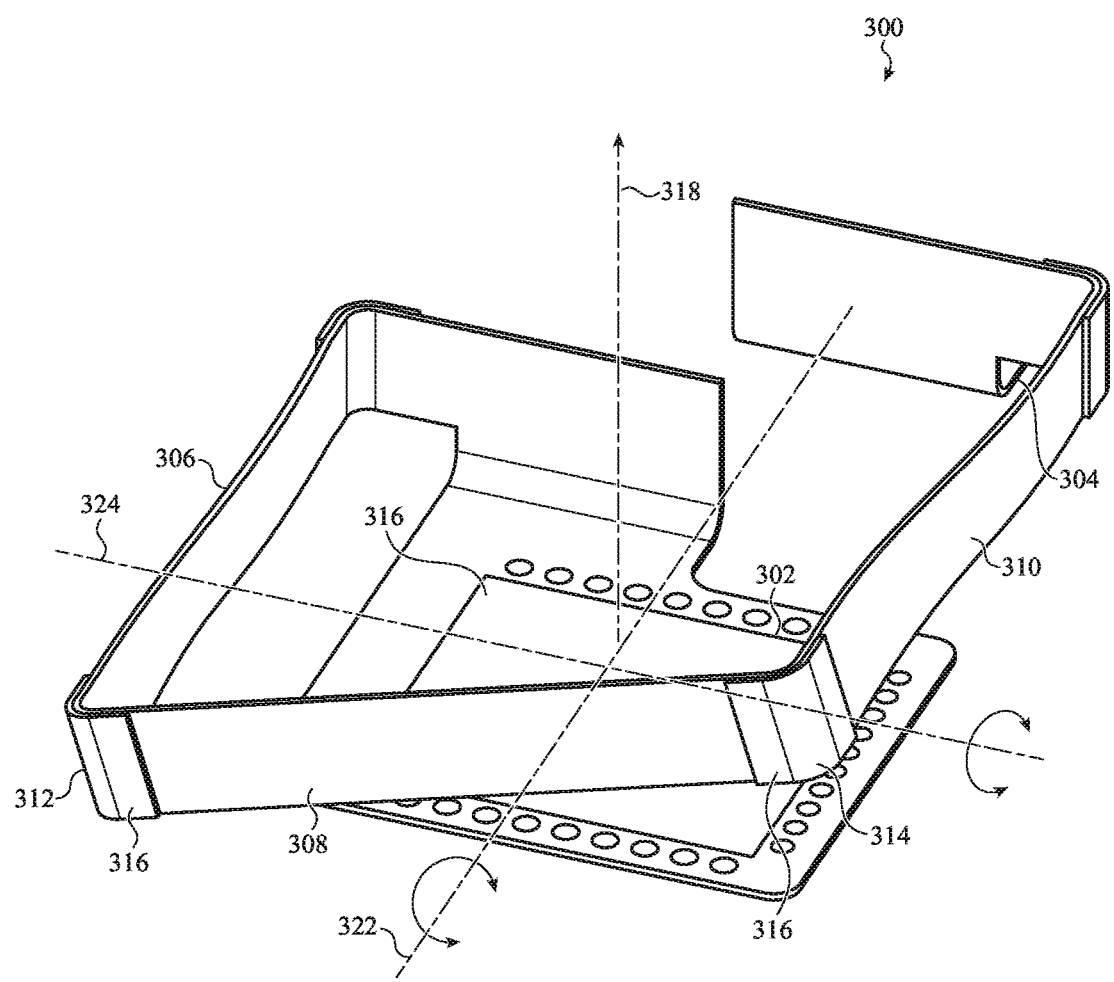

FIGS. 3A and 3B show perspective views of a flex circuit 300 for use with the cameras described here. As shown there, the flex circuit 300 comprises a first end 302, a second end 304 and a plurality of planar segments connecting the first end 302 to the second end 304. As shown there, the plurality of planar segments may comprise a first segment 306, a second segment 308, and a third segment 310. The first segment 306 may be connected to the second segment 308 at a first bend 312, while the second segment 308 may be connected to the third segment 310 at a second bend 314. Also shown in FIGS. 3A and 3B are electrical connection pads 320 at the first end 302 (which may allow for the image sensor to make electrical connections to the flex circuit 300, either via direct connection with the image sensor or via direct connection to a component such as a substrate that is electrically connected to the image sensor) and optional reinforcement layers 316, which will be described in more detail below.

It should be appreciated that the first end 302 and second end 304 (and the first ends and second ends of the various embodiments of flex circuits described here) may each be formed as a respective planar segment, each of which may be connected to the plurality of planar segments at a corresponding bend. The planar segment corresponding to the first end 302 may be used to connect the first end 302 to an image sensor (and may be positioned such that a normal vector of that planar segment is to a normal vector of the image sensor). Similarly, the planar segment corresponding to the second end 304 may be used to connect the second end 304 to another camera component (e.g., the camera housing or another structure housed therein). It should also be appreciated that the second end 304 of the flex circuit 300 is intended to encompass the portion of the flex circuit 300 that is fixed relative to the camera (or a component therein), to provide a fixed point relative to the moving first end 302 of the flex circuit 300. In any variations of the flex circuits described here, the second ends of those flex circuits may extend beyond what is shown there, and may comprise additional turns and/or bends (e.g., after the flex circuit exits the camera). While three segments (first segment 306, second segment 308, and third segment 310) have been discussed above, it should be appreciated that the flex circuits described here may optionally include more than three segments between the first end and the second end of the flex circuit, such as will be described in more detail below. Indeed, flex circuit 300 is depicted in FIGS. 3A and 3B as having additional planar segments 326 and bends 328 both between the first segment 306 and the first end 302 and between the third segment 310 and the second end 304.

When the camera is configured to move an image sensor (not shown) along a first direction (depicted in FIGS. 3A and 3B as arrow 318), at least the first segment 306 and the third segment 310 may be vertically oriented, such that the normal vector of the segment is perpendicular to the first direction 318. Preferably, the first segment 306 and the third segment 310 are also parallel to each other. While the second segment 308 is also shown in FIGS. 3A and 3B as being vertically oriented relative to the first direction 318, in some variations the second segment 308 may be horizontally oriented relative to the first direction 318, such that the normal vector of the second segment 308 is parallel to the first direction 318. It should be appreciated that when the segments of the flex circuits described here are described as having a particular orientation, it is assumed that the flex circuit is at a neutral position (i.e., unmoved), and that the orientation of particular sections may temporarily change during motion of the image sensor away from the neutral position.

When the image sensor (not shown) is moved along the first direction 318, the first end 302 (which may be fixed relative to the image sensor) will move away from the second end 304 (which may be fixed relative to a housing of the camera), as shown in FIG. 3B. This in turn may place the first segment 306 and/or the third segment 310 under torsional strain (both the first segment 306 and the third segment 310 are shown in FIG. 3B as twisting), and this twisting may accommodate the relative movement between the first end 302 and the second end 304 (and with it, the relative movement between the image sensor and the camera housing) with a relatively low overall resistance to movement. The second segment 308 may rotate (e.g., around a first axis 322 perpendicular to the first direction, which in the variation shown in FIG. 3B is also normal to the second segment 308) and act as a lever arm to facilitate twisting in the first segment 306 and the third segment 310. In some instances, depending on the flex circuit design and the amount of movement along the first direction, the first segment 306 and/or the third segment 310 may each rotate around a respective axis that is perpendicular to the first direction 318 and the first axis 322 (e.g., a parallel to the second axis 324 show in FIG. 3B). It should be appreciated that the deformation shown in FIG. 3B is exaggerated for the purpose of illustration, and that depending on the design on the camera the relative movement between the first end 302 and the second end 304 along the first direction during normal operation may be small relative to the height of the flex circuit in the first direction.

Generally, the stiffness of different regions of the flex circuit may be dependent on the dimensions of the various planar segments of the flex circuit, as well as the thickness (and selection of materials) of the flex circuit. For example, it may be desirable for at least the first segment 306 and the third segment 310 to have relatively high aspect ratios where one dimension is longer than the other. These segments may be positioned where the length (i.e., the longer dimension) of a respective segment is oriented perpendicular to the first direction 318 and the width (i.e., the shorter dimension) is oriented parallel to the first direction 318. This may promote twisting around the length of the segment, which may in turn reduce the amount of force required to move the image sensor along the first direction. Additionally, a longer length of the flex circuit 300 between the first end 302 and the second end 304 may also reduce the force required to move the image sensor along the first direction.

Figure 4A:
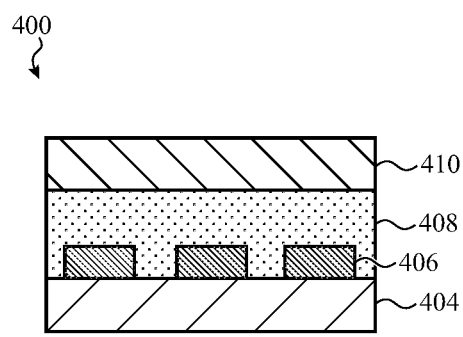
FIGS. 4A and 4B shows cross-sectional views of variations of a first flex circuit and a second flex circuit respectively.
Figure 4B:
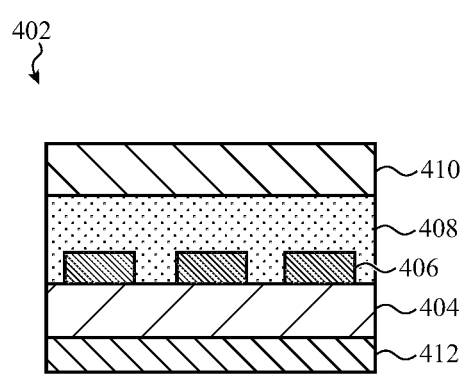

The choice of materials and thicknesses of layers of the stackup of the flex circuit may also impact the stiffness of the flex circuit. FIGS. 4A and 4B show cross-sectional views of variations of a first flex circuit 400 and a second flex circuit 402 respectively. As shown in FIG. 4A, the first flex circuit 400 may comprise a base layer 404, one or more electrical traces 406 (which may be used to route signals to and from an image sensor), and adhesive layer 408, and a coverlay 410. The base layer 404, adhesive layer 408, and coverlay 410 collectively act to insulate the electrical traces 406. These layers may be made from any suitable materials as known in the area of flexible printed circuit board manufacturing. As a non-limiting example, the base layer 404 may be made from a dielectric material such as polyimide or polyester, the electrical traces 406 may be formed from a conductive material such as copper, the coverlay may also be made from a dielectric material. The adhesive layer 408 may be made from any adhesive suitable to bond the base layer 404 to the coverlay 410. It should be appreciated that the first flex circuit 400 need not contain both an adhesive layer 408 and a coverlay 410, but instead may comprise a single material is coated over the electrical traces 406 and the base layer 404 (e.g., a dielectric coating layer such as a photosensitive liquid polyimide layer). The second flex circuit 402 is shown in FIG. 4B and may include the same layers as the first flex circuit 400 (which are labeled the same), but further comprising a shield layer 412, which may be formed from a material (e.g., silver, copper) capable of shielding the electrical traces 406 from electromagnetic interference. While the flex circuits are shown in FIG. 4A as having a single layer of electrical traces 406, it should be appreciated that the flex circuit may comprises multiple layers of electrical traces 406, each of which may be separated from other layers of electrical traces 406 via one or more additional layers (e.g., a dielectric layer).

In some variations, the flex circuits described here may comprise one or more additional reinforcement layers that locally increase the stiffness of a region of the flex circuit. The reinforcement layers may locally increase the thickness (and thereby the stiffness), and may be made from any suitable material or materials (e.g., a plastic, a metallic alloy or the like). For example, in the variation of flex circuit 300 shown in FIGS. 3A and 3B, the flex circuit 300 may comprise a reinforcement layer 316 attached to the first end 302. When an image sensor (not shown) is fixed relative to the first end 302, the image sensor may at least partially overlap the reinforcement layer 316. In turn, the reinforcement layer 316 may provide additional structural support to the image sensor.

Additionally or alternatively, the flex circuit may comprise one or more reinforcement layers 316 positioned at some or all of the bends in the flex circuit. For example, in the variation of flex circuit 300 shown in FIGS. 3A and 3B, the flex circuit 300 may comprise a reinforcement layer 316 at each of the first bend 312 and at the second bend 314. Placement of a reinforcement layer 316 at a given bend may reduce the concentration of stresses that may occur in that bend during twisting of an adjacent segment of the flex circuit (or other movement that occurs near that bend).

Figure 5A:
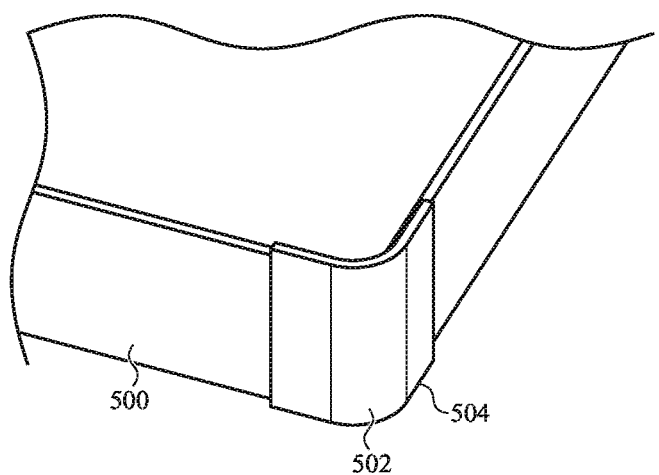
FIGS. 5A and 5B shows a front perspective view and a rear perspective view, respectively, of a flex circuit having a reinforcement layer.
Figure 5B:
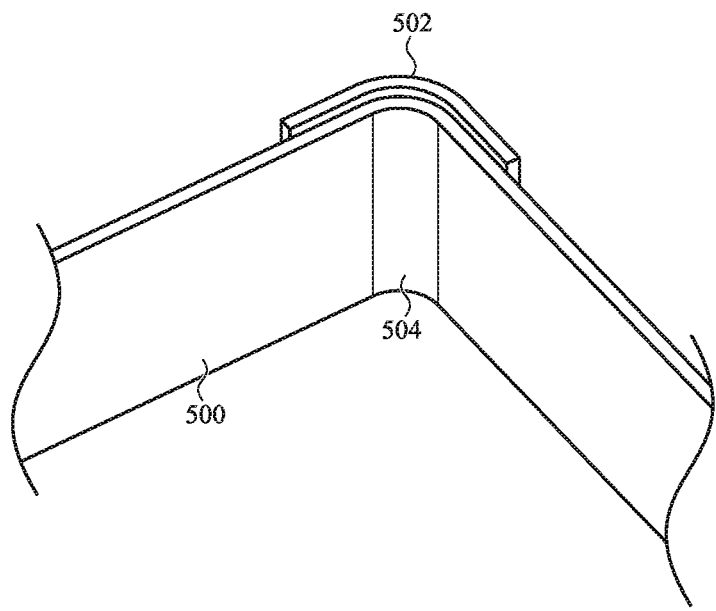

Additionally, in some variations, a reinforcement layer may extend past an edge of remaining layers of the flex circuit. For example, FIGS. 5A and 5B shows a front perspective view and a rear perspective view of a flex circuit 500 having a reinforcement layer 502 at a bend 504. As shown there, the reinforcement layer 502 may extend past the edge of the rest of the flex circuit 500 such that a portion of the reinforcement layer 502 does not overlap with other layers of the flex circuit 500. In variations where the flex circuit may contact one or more end stops (e.g., during a drop event such as described above), the reinforcement layer 502 may contact the end stop and act as a bumper, which in turn may reduce the likelihood that the remaining layers of the flex circuit get damaged. For example, if the reinforcement layer 502 extends beyond the remaining layers of the flex circuit 500 in a first direction, movement of the flex circuit 500 in the first direction may cause the reinforcement layer 502 to contact an end stop (not shown) first. Indeed, a flex circuit and camera may preferably be designed such that any contact between the flex circuit and end stops occurs between reinforcement layer(s) and respective end stop(s).

Figure 6A:
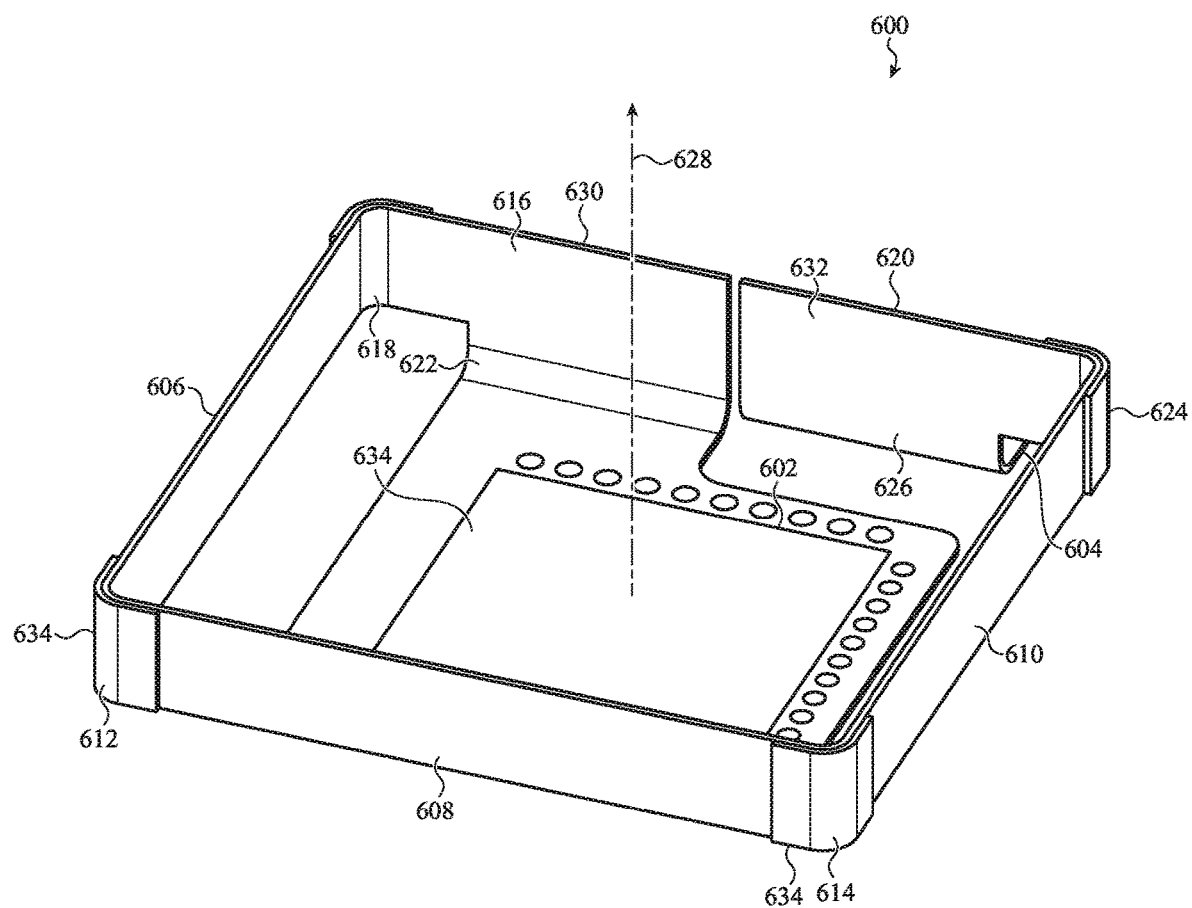
FIG. 6A shows a perspective view of a variation of a flex circuit for use with the cameras described here.

While the flex circuits described above as having first, second, and third segments, it should be appreciated that the flex circuits described here may have more than three planar segments. For example, FIG. 6A shows one variation of a flex circuit 600 that has at least five segments connecting a first end to a second end of the flex circuit 600. As shown there, the flex circuit 600 may comprise a first end 602 (which may be fixed relative to an image sensor), a second end 604 (which may be fixed relative to another component of the camera), and a plurality of segments comprising a first segment 606, a second segment 608, and a third segment 610. The plurality of segments may connect the first end 602 to the second end 604. The first segment 606 may be connected to the second segment 608 at a first bend 612, while the second segment 608 may be connected to the third segment 610 at a second bend 614. As shown there, the first segment 606, second segment 608, and third segment 610 may each be vertically oriented, such that the normal vector of each respective segment is perpendicular to a common direction (e.g., perpendicular to the optical axis of the camera at the image sensor). Preferably, the first segment 606 and the third segment 610 are also parallel to each other. The first segment 606 and third segment 610 may twist, with the second segment 608 acting as a lever arm, as the first end 602 moves away from the second end 604 along a first direction 628, such as described above in relation to flex circuit 300 of FIGS. 3A and 3B. Additionally, the flex circuit 600 may comprise one or more reinforcement layers 634, which may be positioned at any suitable parts of the flex circuit 600, such as described in more detail above.

As shown in FIG. 6A, the flex circuit 600 may further comprise a fourth segment 616 and a fifth segment 620. The fourth segment 616 may be connected to the first segment 606 at a third bend 618, and may further be connected to the first end 602 at a fourth bend 622. The fifth segment 620 may be connected to the third segment 610 at a fifth bend 624, and may further be connected to the second end 604 at a sixth bend 626. In some variations, the fourth segment may comprise a turn (e.g., a first turn 630 shown in FIG. 6A) between the third bend 618 and the fourth bend 622, such that the third bend 618 and fourth bend 622 bend around different (e.g., perpendicular) axes. Additionally or alternatively, the fifth segment 620 may comprise a turn (e.g., a second turn 632 shown in FIG. 6A) between the fifth bend 624 and the sixth bend 626, such that the fifth bend 624 and sixth bend 626 bend around different (e.g., perpendicular) axes.

In the variation shown in FIG. 6A, the fourth segment 616 and the fifth segment 620 may be vertically oriented such that the normal vector of each respective segment is perpendicular to the first direction 628. The fourth segment 616 and fifth segment 620 may be parallel to each other, and may further be co-located in a common plane (though it should be appreciated that the fourth segment 616 and the fifth segment 620 may be positioned in different planes).

In some variations, the fourth segment 616 and fifth segment 620 may each be designed to have sufficient stiffness such that at least a portion of the fourth segment 616 is fixed in position relative to the first end 602 and at least a portion of the fifth segment 618 is fixed in position relative to the second end 604 for movement of the flex circuit across the operating range of the actuator assembly. By acting as a fixed extension of the first end 602 and second end 604 respectively, the fourth segment 616 and fifth segment 620 may promote twisting of the first segment 606 and third segment 610.

Figure 6B:
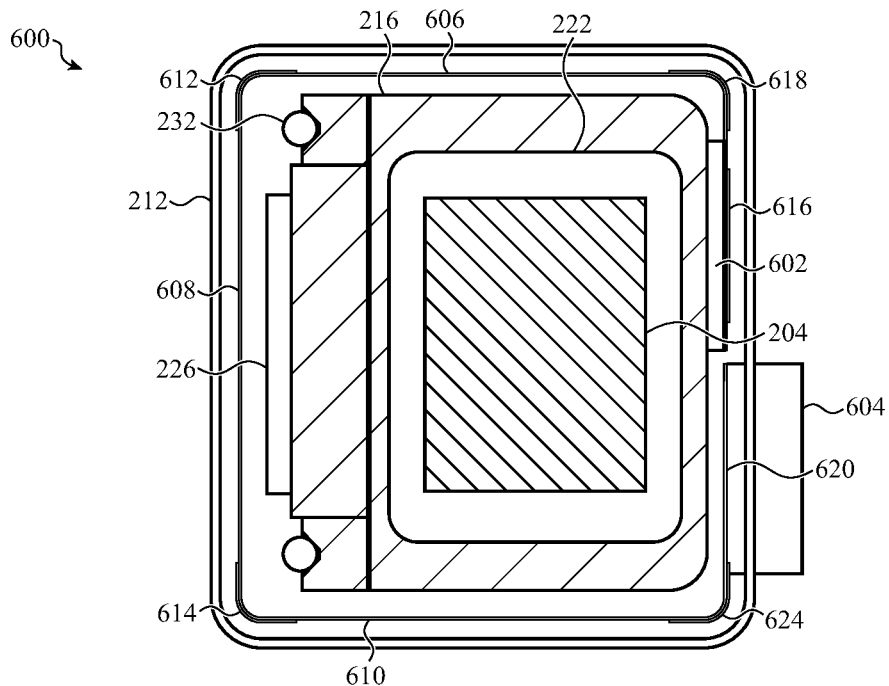
FIGS. 6B and 6C show top views of two configurations of how the flex circuit of FIG. 6A may be integrated into the illustrative variation of camera of FIGS. 2A and 2B.
Figure 6C:
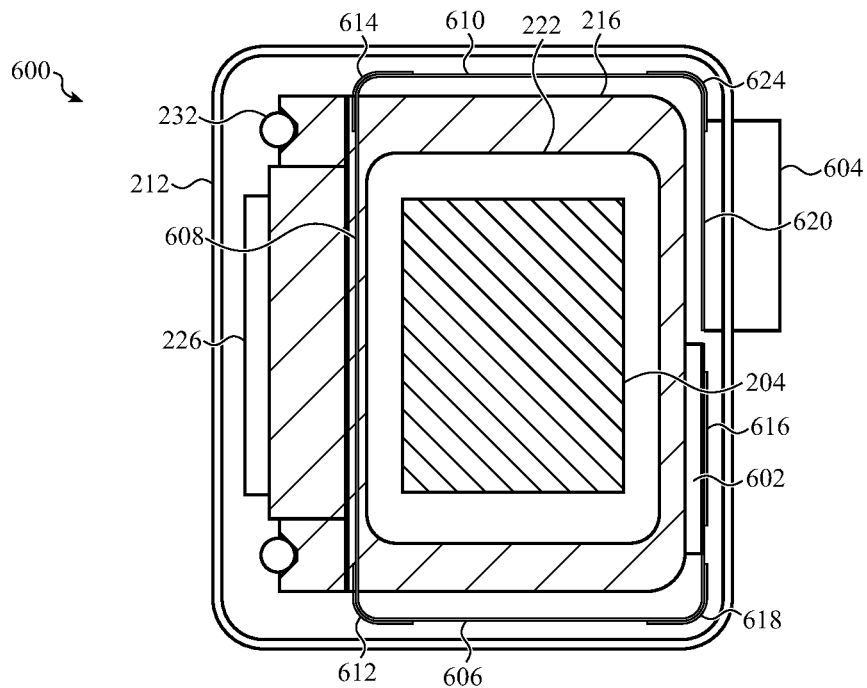

FIGS. 6B and 6C show top views of two configurations of how flex circuit 600 may be integrated into the illustrative variation of camera 200 described above with respect to FIGS. 2A and 2B. Common components from FIGS. 2A and 2B will share the same labels, and certain components of camera 200 or portions thereof (e.g., the lens holder 214 and a top portion of housing 212) are omitted from the figures to better illustrate other camera components. As shown in FIG. 6B, the first end 602 of the flex circuit 600 may be fixed relative to image sensor 204 and may be fixed relative to sensor carrier 216. The fourth segment 616 and the fifth segment 620 may be positioned on a common side of the camera, and the plurality of segments of the flex circuit may wrap around or otherwise surround the sensor carrier 216 on all sides of the sensor carrier 216. Additionally, the flex circuit may wrap around the portion of the lens holder (not shown) that holds coil 226.

In the variation shown in FIG. 6B, the camera 200 may need to be sized with sufficient space to accommodate the flex circuit 600 on each side of the camera 200. In other variations, at least one segment of the plurality of segments of the flex circuit 600 may overlap with the sensor carrier 216, which may allow for further reduction in the footprint of the camera 200. For example, in the variation shown in FIG. 6C, one of the segments (the second segment 608 as shown there, but it may be a different segment in other variations) may cross over a section of the sensor carrier 216. In other words, that segment may be positioned between the sensor carrier 216 and the lens holder, and may be further positioned such that the flex circuit is not positioned between the coil 226 and an adjacent wall of the housing (not shown). This may allow the flex circuit 600 to take advantage of an otherwise existing space between the sensor carrier 216 and the lens holder 214. It should be appreciated that the camera 200 and flex circuit 600 may be configured such that the flex circuit 600 does not contact the lens holder 214 or the sensor carrier 216 during normal operation (e.g., across the operating range), but that may be further configured that lens holder and/or the sensor carrier 216 may act as end stops for the flex circuit 600.

Figure 7A:
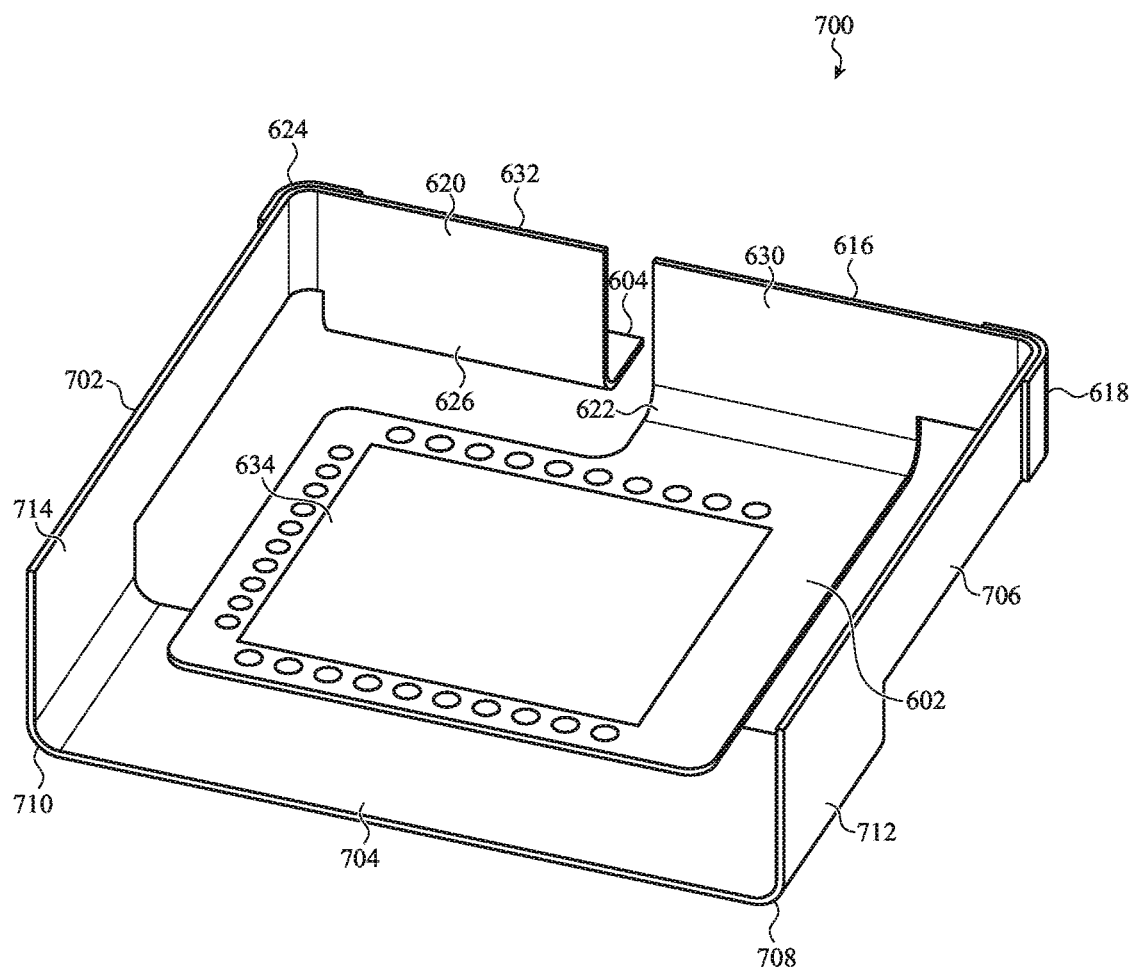
FIG. 7A shows a perspective view of a variation of a flex circuit for use with the cameras described here.

While the second segment 608 is shown in FIGS. 6A-6C as being vertically oriented, it should be appreciated that in some instances the second segment of a flex circuit may be horizontally oriented such that a normal vector to the second segment is parallel to direction of motion of the image sensor. FIG. 7A shows a perspective one such variation of a flex circuit 700. As shown there, the flex circuit 700 may include a plurality of segments comprising a first segment 702, a second segment 704, and a third segment 706. The first segment 702 may be connected to the second segment 704 at a first bend 708, while the second segment 704 may be connected to the third segment 706 at a second bend 710. As shown there, the first segment 702, and third segment 706 may each be vertically oriented, such that the normal vector of each respective segment is perpendicular to a first direction (e.g., a direction of motion of the image sensor as discussed above). Preferably, the first segment 702 and the third segment 706 are also parallel to each other. The second segment 704 is horizontally oriented such that a normal vector of the second segment 704 is parallel to the first direction. To facilitate the change in orientation between the first segment 702 and the second segment 704, the first segment 702 may comprise a turn (shown in FIG. 7A as turn 714) which may result in the first bend 708 bending around an axis perpendicular to an axis around which the first bend 612 bends in the flex circuit 600 of FIG. 6A. Similarly, the third segment 706 may comprise a turn (shown in FIG. 7A as turn 712), which will also change the direction of the axis around which the second bend 710 bends.

Figure 7B:
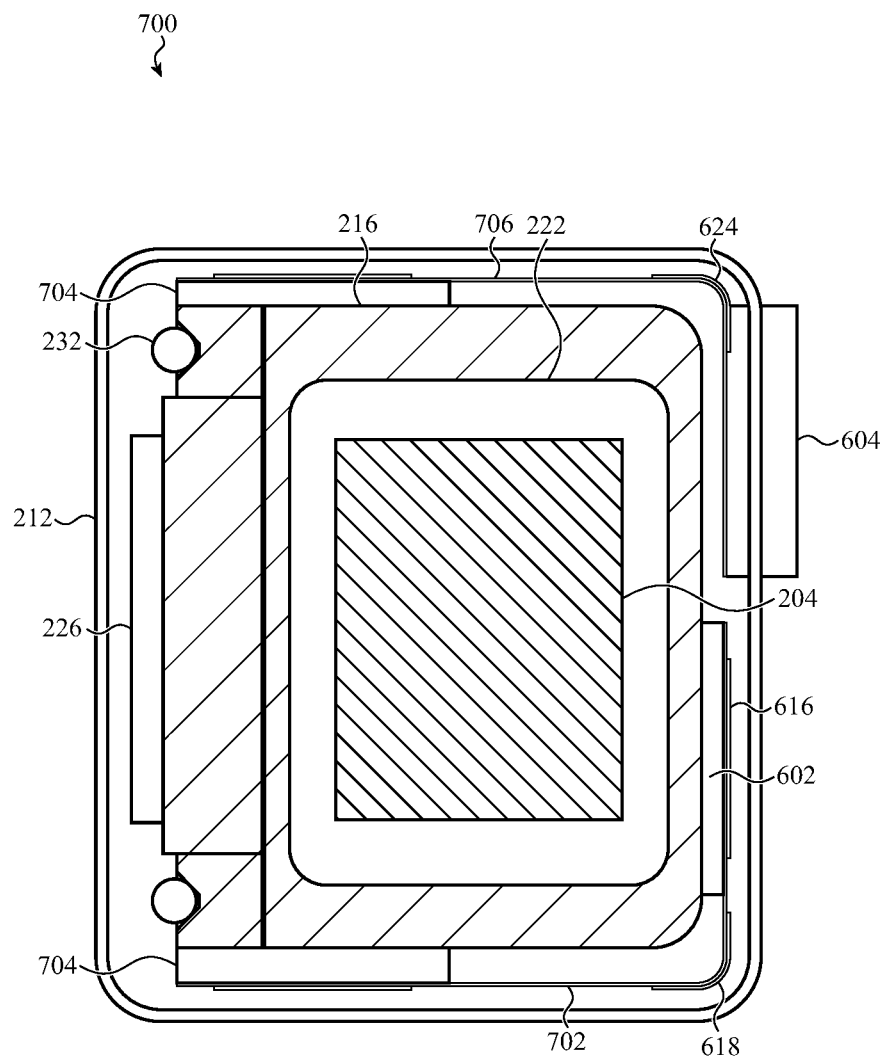
FIG. 7B shows a top view of how the flex circuit of FIG. 7A may be used with the illustrative variation of camera of FIGS. 2A and 2B.

The first segment 702 and third segment 706 may still twist, with the second segment 704 acting as a lever arm during image sensor movement, but the second segment 704 may be positioned beneath a portion of the image sensor and/or sensor carrier, such that the image sensor and/or sensor carrier is positioned between the second segment 704 and the lens. This may allow for a reduction in the width or length of a camera at the cost of camera height. By way of illustration, FIG. 7B shows a top view of how flex circuit 700 may be integrated into the illustrative variation of camera 200 described above with respect to FIGS. 2A and 2B. Common components from FIGS. 2A and 2B will share the same labels, and certain components of camera 200 or portions thereof (e.g., the lens holder 214 and a top portion of housing 212) are omitted from the figures to better illustrate other camera components. As shown there the second segment 704 may be positioned underneath a portion of both the image sensor 204 and sensor carrier 216, such that the image sensor 204 and sensor carrier 216 are positioned between the second segment 704 and the lens 206 and/or lens holder 214 along a direction of motion of the image sensor 204.

The flex circuit 700 may comprise a fourth segment that may comprise a turn and may be connected to the first segment at a third bend and connected to a first end of the flex circuit at a fourth bend, a fifth segment that may comprise a turn and may be connected to the third segment at a fifth bend and connected to a second end of the flex circuit at a sixth bend, and may comprise one or more reinforcement layers. These elements may be configured the same as the corresponding elements from the variation of flex circuit 600 of FIG. 6A, and accordingly are labeled using the same figure labels as used in FIG. 6A.

Figure 8A:
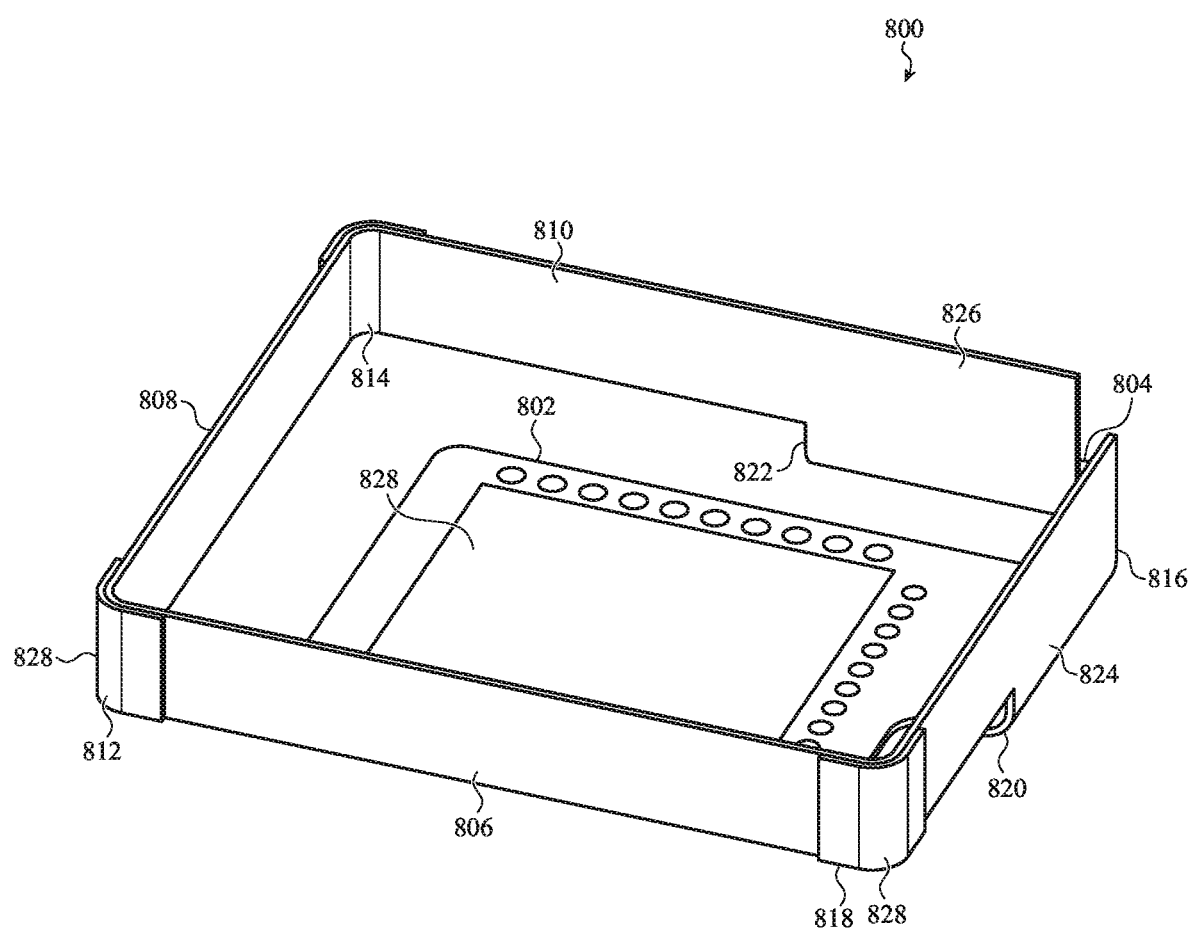
FIG. 8A shows a perspective view of a variation of a flex circuit for use with the cameras described here.

FIG. 8A shows a perspective another variation of a flex circuit 800 that has at least four planar segments positioned connecting a first end to a second end of the flex circuit. As shown there, the flex circuit 800 may comprise a first end 802 (which may be fixed relative to an image sensor), a second end 804 (which may be fixed relative to another component of the camera), and a plurality of segments comprising a first segment 806, a second segment 808, and a third segment 810 that connect the first end 802 to the second end 804. The first segment 806 may be connected to the second segment 808 at a first bend 812, while the second segment 808 may be connected to the third segment 810 at a second bend 814. As shown there, the first segment 806, second segment 808, and third segment 810 may each be vertically oriented, such that the normal vector of each respective segment is perpendicular to a common first direction (e.g., along a direction motion of the image sensor), however, it should be appreciated that the first segment 806, second segment 808, and third segment 810 may be configured such that the second segment 808 is horizontally orientated (as described above with respect to the flex circuit 700 of FIG. 7A). Preferably, the first segment 806 and the third segment 810 are also parallel to each other. The first segment 806 and third segment 810 may twist, with the second segment 808 acting as a lever arm, as the first end 802 moves away from the second end 804 along a first direction, such as described above in relation to flex circuit 300 of FIGS. 3A and 3B. Additionally, the flex circuit 800 may comprise one or more reinforcement layers 828, which may be positioned at any suitable parts of the flex circuit 800, such as described in more detail above.

As shown in FIG. 8A, the flex circuit 800 may further comprise a fourth segment 816. The fourth segment 816 may be connected to the first segment 806 at a third bend 818, and may further be connected to the first end 802 at a fourth bend 820. In some variations, the fourth segment may comprise a turn (e.g., a first turn 824 shown in FIG. 8A) between the third bend 818 and the fourth bend 820, such that the third bend 818 and fourth bend 820 bend around different (e.g., perpendicular) axes. The third segment 810 may be connected to the second end 804 at a fifth bend 822, and may comprise a turn (e.g., a second turn 826 shown in FIG. 8A) between the second bend 814 and the fifth bend 822, such that the second bend 814 and fifth bend 822 bend around different (e.g., perpendicular) axes.

In these variations, it may also be possible for the second segment 808 and fourth segment 816 to twist (e.g., with the first segment 806 acting as a lever arm) during relative movement between the first end and the second end along the first direction. It some of these variations, however, the flex circuit 800 may be configured such that the first segment 806 and the third segment 810 twist more easily than the second segment 808 and the fourth segment 816. If the operating range of the camera actuator assembly is small enough, the flex circuit 800 may experience twisting in the first segment 806 and third segment 810, but not in the second segment 808 or the fourth segment 816 when the flex circuit 800 moves within the operating range. While the first segment 806 and third segment 810 are shown in FIG. 8A as being connected to the fourth segment 816 and second end 804 respectively, it should be appreciated that in other embodiments that third segment 810 may be connected to the fourth segment 816 (and with it, the first end 802) while the first segment 806 may be connected to the second end 804.

Figure 8B:
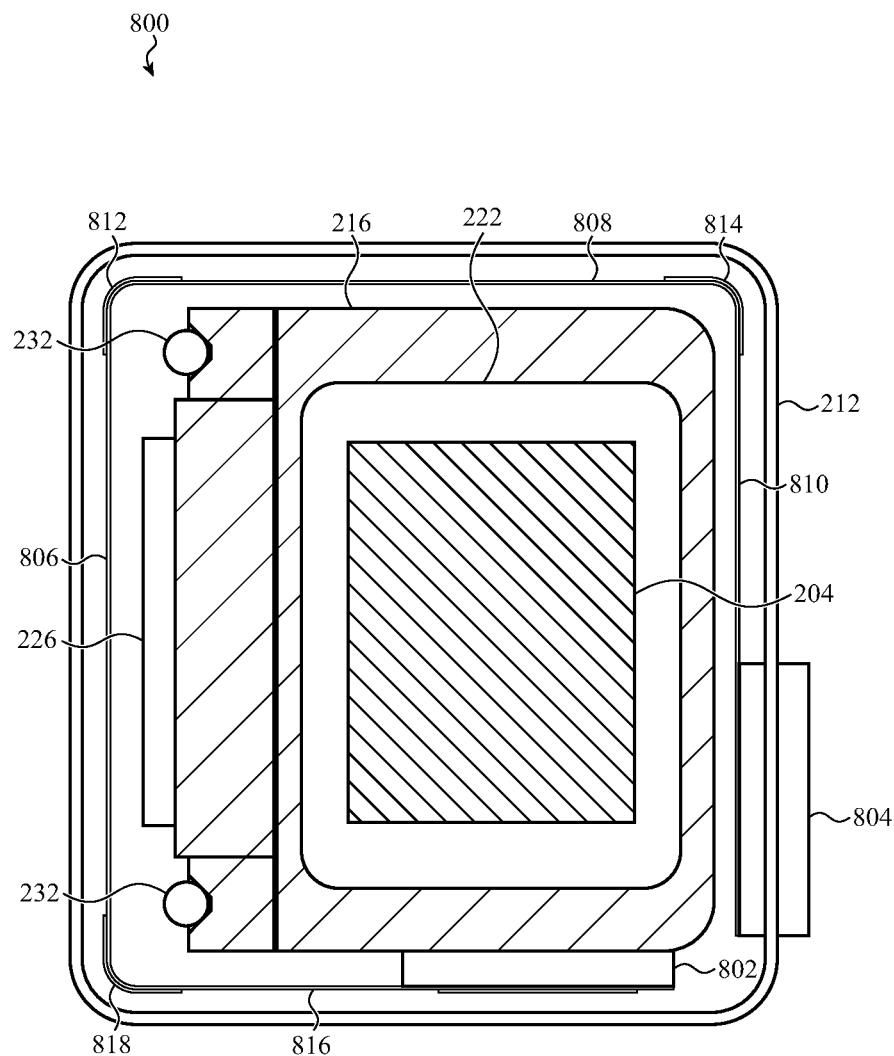
FIG. 8B shows a top view of how the flex circuit of FIG. 8A may be used with the illustrative variation of camera of FIGS. 2A and 2B.

FIG. 8B shows a top view of how flex circuit 800 may be integrated into the illustrative variation of camera 200 described above with respect to FIGS. 2A and 2B. Common components from FIGS. 2A and 2B will share the same labels, and certain components of camera 200 or portions thereof (e.g., the lens holder 214 and a top portion of housing 212) are omitted from the figures to better illustrate other camera components. As shown there the plurality of segments of the flex circuit 800 may wrap around or otherwise surround the sensor carrier 216 on all sides of the sensor carrier 216. Additionally, the flex circuit 800 may wrap around the portion of the lens holder (not shown) that holds coil 226. Each of the four segments of the flex circuit 800 may be positioned adjacent to a different respective wall of the camera housing (not shown). In other instances, one or more segments of the flex circuit 800 may be positioned to overlap at least a portion of the image sensor 204 and/or sensor carrier 216, such as discuss above with respect to FIG. 6B.

Figure 9A:
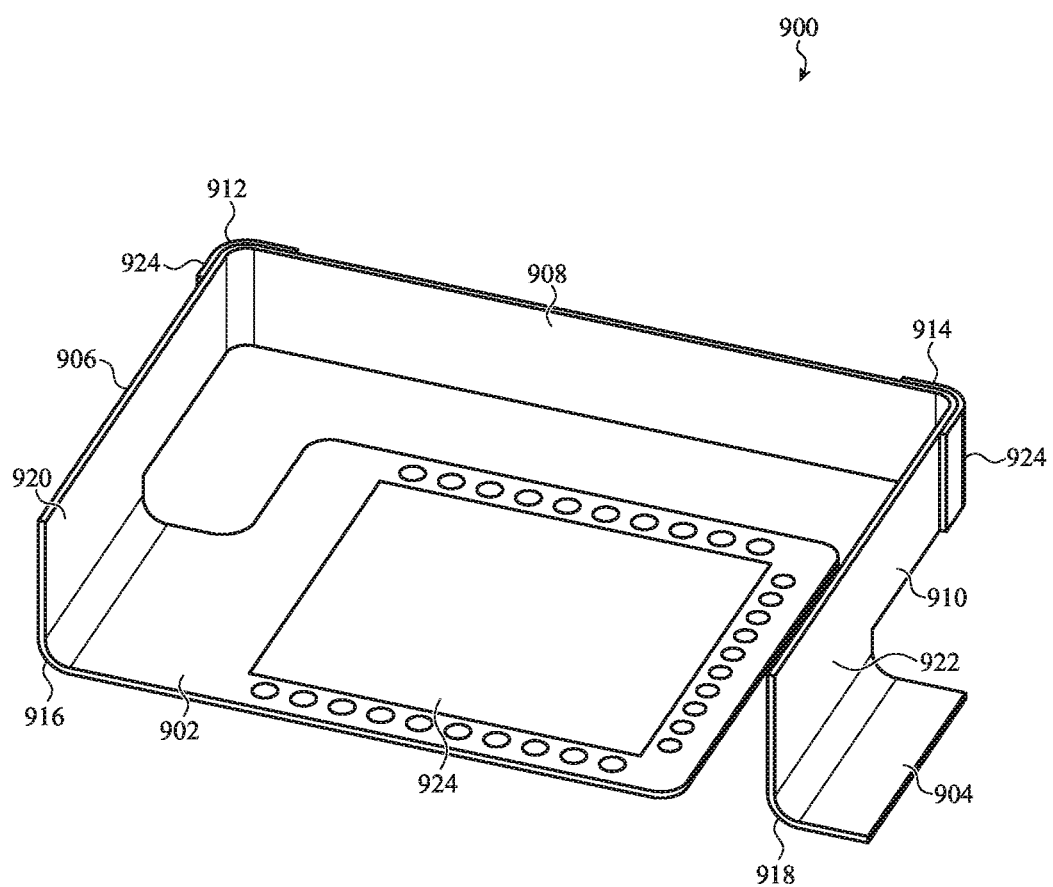
FIG. 9A shows a perspective view of a variation of a flex circuit for use with the cameras described here.

FIG. 9A shows a perspective another variation of a flex circuit 900 that has at three segments connecting a first end to a second end of the flex circuit 900, two of which are connected respectively to the first end and the second end at respective bends. As shown there, the flex circuit 900 may comprise a first end 902 (which may be fixed relative to an image sensor), a second end 904 (which may be fixed relative to another component of the camera), and a plurality of planar segments comprising a first segment 906, a second segment 908, and a third segment 910 that connect the first end 902 to the second end 904. The first segment 906 may be connected to the second segment 908 at a first bend 912, while the second segment 908 may be connected to the third segment 910 at a second bend 914. As shown there, the first segment 906, second segment 908, and third segment 910 may each be vertically oriented, such that the normal vector of each respective segment is perpendicular to a common first direction (e.g., along a direction motion of the image sensor), however, it should be appreciated that the first segment 906, second segment 908, and third segment 910 may be configured such that the second segment 908 is horizontally orientated (as described above with respect to the flex circuit 700 of FIG. 7A). Preferably, the first segment 906 and the third segment 910 are also parallel to each other. The first segment 906 and third segment 910 may twist, with the second segment 908 acting as a lever arm, as the first end 902 moves away from the second end 904 along the first direction, such as described above in relation to flex circuit 300 of FIGS. 3A and 3B. Additionally, the flex circuit 900 may comprise one or more reinforcement layers 924, which may be positioned at any suitable parts of the flex circuit 900, such as described in more detail above.

As mentioned above, the first segment 906 may be connected to the first end 902 (which in turn may be connected to an image sensor) at a third bend 916. In some of these variations, the first segment 906 may comprise a turn (e.g., a first turn 920) such that the first bend 912 and the third bend 916 bend around different (e.g., perpendicular) axes. Similarly, the third segment 910 may be connected to the second end 904 at a fourth bend 918. In some of these variations, the third segment 910 may comprise a turn (e.g., a second turn 922) such that the second bend 914 and the fourth bend 918 bend around different (e.g., perpendicular) axes.

Figure 9B:
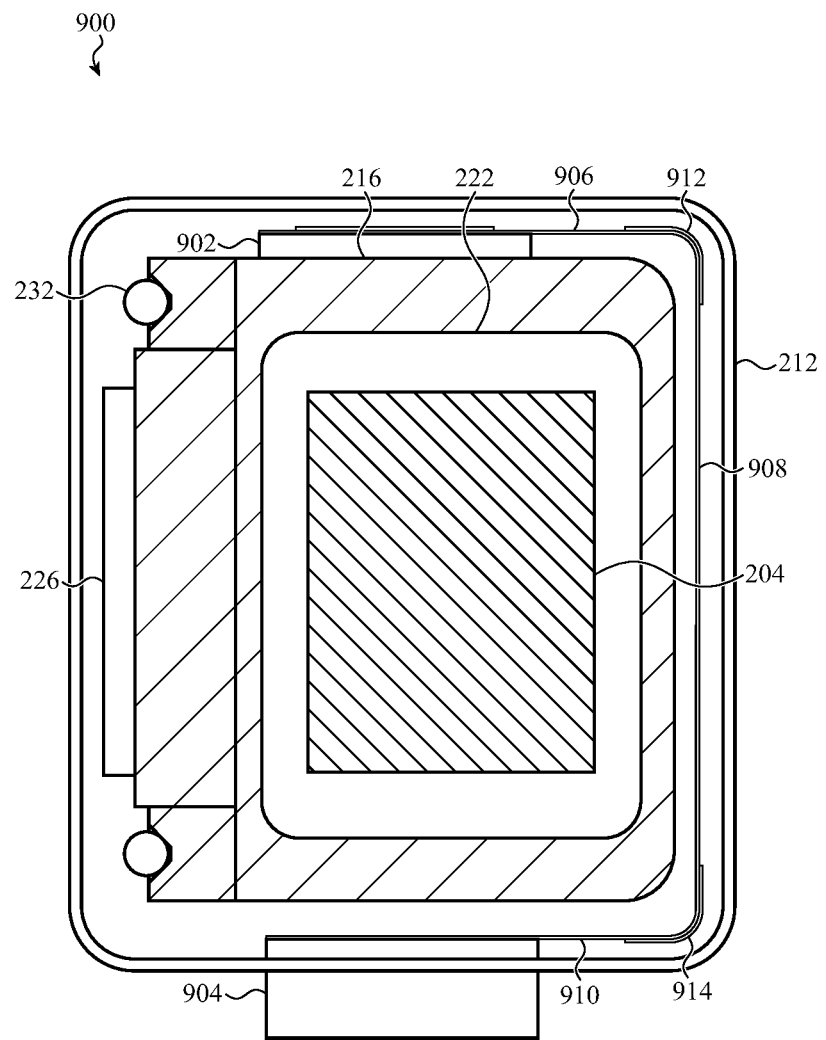
FIG. 9B shows a top view of how the flex circuit of FIG. 9A may be used with the illustrative variation of camera of FIGS. 2A and 2B.

When the variation of flex circuit 900 shown in FIG. 9A is placed in a camera, the flex circuit 900 may be positioned adjacent to three sides of the camera, which may allow for a reduction in camera footprint relative to other embodiments of flex circuits described above where the flex circuit are positioned adjacent to four sides of the camera. For example, FIG. 9B shows a top view of how flex circuit 900 may be integrated into the illustrative variation of camera 200 described above with respect to FIGS. 2A and 2B. Common components from FIGS. 2A and 2B will share the same labels, and certain components of camera 200 or portions thereof (e.g., the lens holder 214 and a top portion of housing 212) are omitted from the figures to better illustrate other camera components. As shown there the plurality of segments of the flex circuit 900 may wrap around or otherwise surround the sensor carrier 216 on three sides of the sensor carrier 216. While the flex circuit 900 is positioned in FIG. 9B such that the flex circuit 900 is not positioned between the coil 226 and an adjacent wall of the camera, it should be appreciated that it may be a different side of the camera 200 at which the flex circuit 900 is not present. Because the camera does not require a minimum spacing at that side to accommodate the flex circuit 900, the footprint of the camera 200 may be reduced relative to designs in which the flex circuit is present at that side of the camera 200.

It should be appreciated that the flex circuits and cameras described here may be integrated into any suitable system. In some instances, a camera may be made as a standalone device. In other embodiments, the cameras described here may be incorporated into other electronic device, such as mobile telephones (e.g., smart phones), computers, tablets, gaming devices, peripherals thereof, or the like.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A camera, comprising:
 a lens;
 an image sensor positioned to receive light through the lens;
 an actuator assembly configured to move the image sensor along a first direction within the camera; and
 a flex circuit, the flex circuit comprising:
  a plurality of planar segments comprising a first segment connected to a second segment via a first bend, and a third segment connected to the second segment via a second bend;

a first end; and
a second end,
wherein the plurality of planar segments connect the first end to the second end;
wherein the first end is fixed relative to the image sensor and moveable relative to the second end when the image sensor moves along the first direction, and
wherein the flex circuit is positioned such that the first segment twists around a length of the first segment when the image sensor moves along the first direction.

2. The camera of claim 1, wherein the first segment is oriented such that a normal vector of the first segment is perpendicular to the first direction and the third segment is oriented such that a normal vector of the third segment is perpendicular to the first direction.

3. The camera of claim 2, wherein the first segment is parallel to the third segment.

4. The camera of claim 2, wherein the second segment is oriented such that a normal vector of the second segment is parallel to the first direction.

5. The camera of claim 2, wherein the second segment is oriented such that a normal vector of the second segment is perpendicular to the first direction.

6. The camera of claim 1, wherein the flex circuit further comprises a fourth segment, wherein the fourth segment is connected to the first segment at a third bend.

7. The camera of claim 6, wherein the fourth segment is connected to the first end at a fourth bend.

8. The camera of claim 7, wherein the third segment is connected to the second end at a fifth bend.

9. The camera of claim 6, wherein the flex circuit further comprises a fifth segment, wherein the fifth segment is connected to the third segment at a fourth bend.

10. The camera of claim 1, wherein the first direction is parallel to an optical axis of the camera.

11. The camera of claim 1, further comprising a sensor carrier fixed relative to the image sensor and a lens holder connected to the lens, wherein the second segment is positioned between the sensor carrier and the lens holder.

12. The camera of claim 1, further comprising a sensor carrier fixed relative to the image sensor and a lens holder connected to the lens, wherein the sensor carrier is positioned between the second segment and the lens holder.

13. A camera, comprising:
a lens;
an image sensor positioned to receive light through the lens;
an actuator assembly configured to move the image sensor along a first direction within the camera; and
a flex circuit comprising a plurality of planar segments connected via one or more bends, wherein the flex circuit is connected to and positioned relative to the image sensor such that at least one of the plurality of planar segments twists along a length thereof during movement of the image sensor along the first direction.

14. The camera of claim 13, wherein the at least one of the plurality of planar segments comprises a first segment,
wherein a length of the first segment is oriented perpendicular to the first direction and a width of the first segment is oriented parallel to the first direction, and
wherein the first segment twists around the length of the first segment during movement of the image sensor along the first direction.

15. The camera of claim 14, wherein the flex circuit comprises a first end fixed relative to the image sensor, and wherein the first segment is connected to the first end at a first bend.

16. The camera of claim 13, wherein the wherein the first direction is parallel to an optical axis of the camera.

17. An arrangement comprising:
an image sensor having an optical axis; and
a flex circuit comprising:
a first end fixed relative to the image sensor;
a second end; and
a plurality of planar segments connecting the first end to the second end and comprising a first segment, a second segment, and a third segment,
wherein the first segment is connected to the second segment at a first bend and the second segment is connected to the third segment at a third bend,
wherein the first segment is oriented such that a normal vector of the first segment is perpendicular to the optical axis of the image sensor and the third segment is oriented such that a normal vector of the third segment is perpendicular to the optical axis of the image sensor; and
wherein the second segment is oriented such that a normal vector of the second segment is parallel to the optical axis of the image sensor.

18. The arrangement of claim 17, wherein the first segment is parallel to the third segment.

19. The arrangement of claim 17, where the second segment is oriented such that a normal vector of the second segment is perpendicular to the optical axis of the image sensor.

* * * * *